United States Patent
Demirci et al.

(10) Patent No.: US 11,598,802 B2
(45) Date of Patent: Mar. 7, 2023

(54) OUTPUT TERMINAL FAULT DETECTION CIRCUIT

(71) Applicant: Texas Instruments Incorporated, Dallas, TX (US)

(72) Inventors: Kemal Safak Demirci, Dallas, TX (US); Shanmuganand Chellamuthu, Richardson, TX (US); Qunying Li, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 17/168,528

(22) Filed: Feb. 5, 2021

(65) Prior Publication Data

US 2022/0252663 A1   Aug. 11, 2022

(51) Int. Cl.
  *G01R 31/28* (2006.01)
  *H03K 5/24* (2006.01)
  *H03K 19/20* (2006.01)
  *H03F 3/45* (2006.01)

(52) U.S. Cl.
  CPC ..... *G01R 31/2853* (2013.01); *H03F 3/45475* (2013.01); *H03K 5/24* (2013.01); *H03K 19/20* (2013.01)

(58) Field of Classification Search
  CPC .. G01R 31/2853; H03F 3/45475; H03K 5/24; H03K 19/20; H02H 3/10; H02H 3/105; H02H 3/16; H02H 3/167; H02H 3/26; H02H 3/36
  See application file for complete search history.

(56) References Cited

U.S. PATENT DOCUMENTS

| 5,376,899 | A | | 12/1994 | Pass |
| 5,488,306 | A | * | 1/1996 | Bonaccio ............... G01R 31/58 324/540 |
| 2015/0155843 | A1 | | 6/2015 | Scott et al. |

FOREIGN PATENT DOCUMENTS

| JP | 2008042063 A | 2/2008 |
| JP | 4389360 B2 | 12/2009 |

OTHER PUBLICATIONS

International Search Report in corresponding PCT Application No. PCT/US2022/015467, dated May 26, 2022 (2 pages).
Machine Translation for JP2008042063A.
Machine Translation for JP4389360B2.

* cited by examiner

*Primary Examiner* — Jung Kim
(74) *Attorney, Agent, or Firm* — Valerie M. Davis; Frank D. Cimino (57) ABSTRACT

A circuit includes a gain stage, first and second amplifiers, and a comparison circuit. The gain stage has an input and an output. The first amplifier has an input and an output. The input of the first amplifier is coupled to the input of the gain stage. The second amplifier has an input and an output. The input of the second amplifier is coupled to the output of the gain stage. The comparison circuit is coupled to the outputs of the first and second amplifiers. The comparison circuit is configured to compare signals on the outputs of the first and second amplifiers and to generate a fault flag signal responsive to the output signal from the first amplifier being different than the output signal from the second amplifier.

20 Claims, 6 Drawing Sheets

OUTPUT TERMINAL FAULT DETECTION CIRCUIT

BACKGROUND

Electronic systems have multiple electronic components connected together to perform one or more functions. An output signal from a first component (e.g., an integrated circuit, "IC") may be provided as an input signal to a second component. The second component responds to the signal from the first component to perform a certain function. If the first component delivers an erroneous signal to the second component, the second component may react in an undesirable way thereby potentially detrimentally impacting overall system behavior.

SUMMARY

In one example, a circuit includes a gain stage, first and second amplifiers, and a comparison circuit. The gain stage has an input and an output. The first amplifier has an input and an output. The input of the first amplifier is coupled to the input of the gain stage. The second amplifier has an input and an output. The input of the second amplifier is coupled to the output of the gain stage. The comparison circuit is coupled to the outputs of the first and second amplifiers. The comparison circuit is configured to compare signals on the outputs of the first and second amplifiers and to generate a fault flag signal responsive to the output signal from the first amplifier being different than the output signal from the second amplifier.

BRIEF DESCRIPTION OF THE DRAWINGS

For a detailed description of various examples, reference will now be made to the accompanying drawings in which.

The same reference numbers are used in the drawings to designate the same or similar (either functionally and/or structurally) features.

DETAILED DESCRIPTION

As many systems, such as industrial and automotive systems, become more complex with technological advances, risks from system and random hardware failures increase. These failures should be prevented and/or detected using safety diagnostics particularly for safety critical applications. In such systems, integrated circuits (ICs) can improve the system reliability by simplifying the system level implementation due to integration of system components within the IC and by offering increased system level diagnostic coverage to detect failures. However, this level of integration adds complexity within the IC itself and makes self-diagnostics within the IC advantageous.

One of the IC level diagnostics is detection of shorts between output terminals (also called pins) to other terminals of the IC. In one example, a first IC provides an output signal to a second IC via an electrical conductor. The conductor may be part of a wiring harness in some examples. The signal communicated from the first IC to the second IC may be unintentionally altered. In one example, the output terminal of the first IC may be shorted to the power supply or to ground. The first IC's output signal may be a differential signal and thus a pair of terminals of the first IC may be connected to a corresponding pair of terminals on the second IC. The two terminals of the first IC may unintentionally short together. The misconnections described above may be temporary (or permanent) and may result, for example, from dirt or other types of contaminants in the connector of the wiring harness connected to the first IC.

Output terminal shorts can damage not only the IC itself but also other system components connected to the same wiring harness, which can be very costly in, for example, automotive applications. In addition, such shorts can result in incorrect/undesirable voltages at output terminals, which can impact system operation. For instance, if the output voltage from an IC is used in digital signal processing (DSP) through an analog-to-digital converter (ADC) in the subsequent stages of the system, the system operation may be faulty/incorrect. Therefore, output terminal shorts should be detected and appropriate safety measures should be activated. The embodiments described herein provide real-time (during normal system operation without a need for an interrupt) detection of output terminal shorts.

The embodiments described herein pertain to an output terminal fault detection circuit integrated on an IC. The output terminal fault detection circuit couples to an output gain stage of the IC and monitors the input and output signals of the output gain stage. By monitoring the input and output signals of the IC's output gain stage, the output terminal fault detection circuit detects whether the output signal from the output gain stage (which is provided through an output terminal of the IC to a second IC) deviates from a valid level and generates a fault flag signal in response to detection that the output signal has deviated from a valid level. The fault flag signal may be provided to the output gain stage to thereby cause the output gain stage to, for example, tri-state its output (e.g. causing the output to go into a high-impedance state). The second IC that receives the output signal detects that the output of the first IC has been tri-stated and may enter a safe mode of operation rather than attempting to continue to respond to the output signal. In another example, the fault flag signal may be provided to an output terminal of the IC, and can be provided to the second IC to respond as appropriate.

Accordingly, the output terminal fault detection circuit provides real-time monitoring of the output gain stage and the output terminal(s) to which the output gain stage is connected. Permanent or intermittent faults can thus be detected by the output terminal fault detection circuit. The output terminal fault detection circuit processes system signals and thus externally supplied test signals are not needed to detect a fault.

Figure 1:
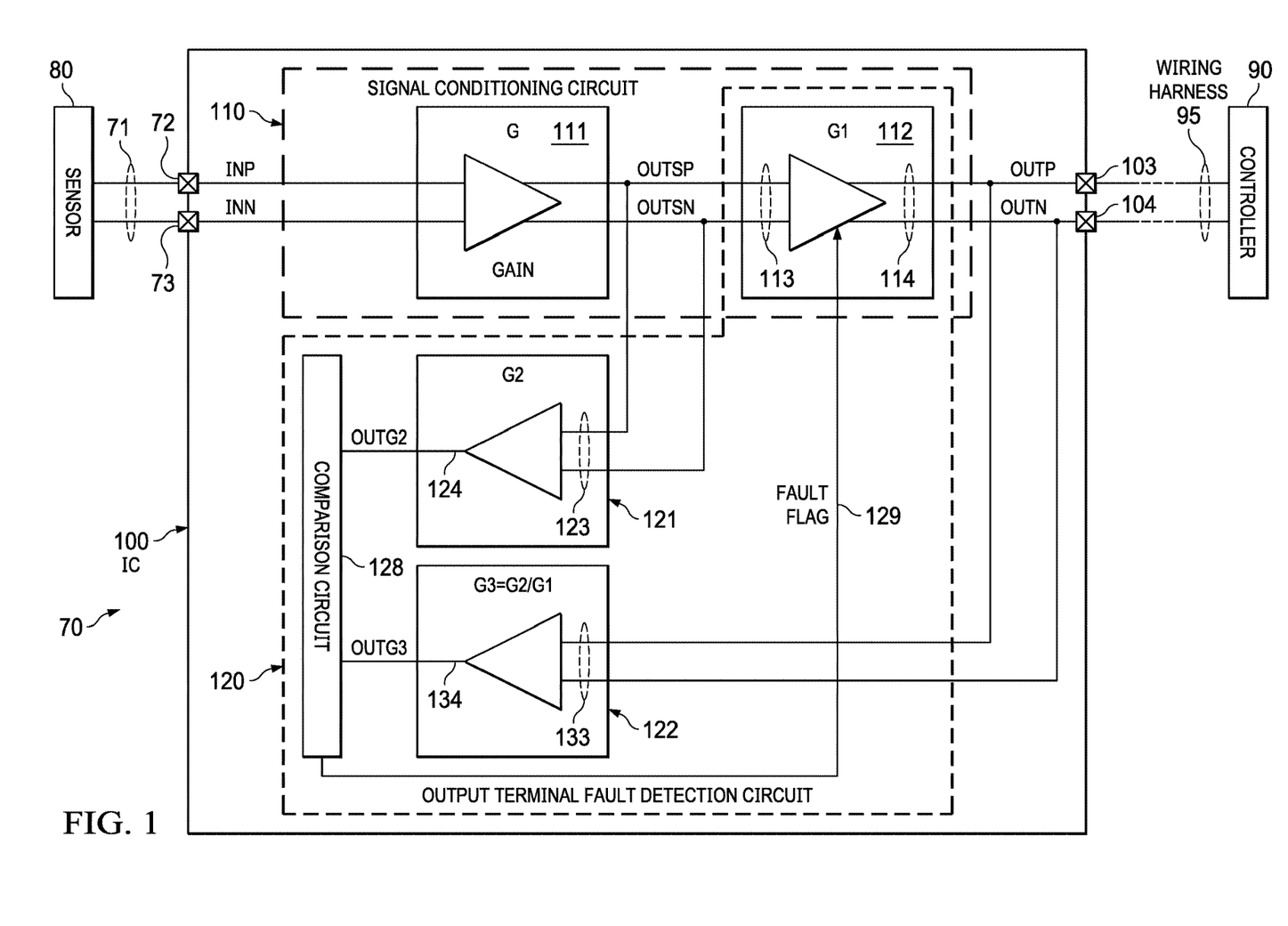
FIG. 1 illustrates an example of an integrated circuit (IC) containing an output terminal fault detection circuit that generates a fault flag signal to disable an output circuit upon detection of a fault on an output terminal.

FIG. 1 illustrates an electronic system 70 comprising a sensor 80, an IC 100, and a controller 90. The sensor may be any type of sensor. In one example, the electronic system 70 may be implemented as part of an automobile or industrial application. The sensor 80 may be, for example, an angular position sensor for detecting the angular position of a rotatable motor shaft. In this example, the sensor 80 provides a differential output signal 71 to input terminals 72 and 73 of the IC 100. A differential signal includes a pair of signals in which one signal is referenced with respect to the other signal with neither signal necessarily being ground. The sensor's output signal 71 may be an analog signal. The signals on the input terminals 72 and 73 are shown as INP and INN, respectively.

Figure 7:
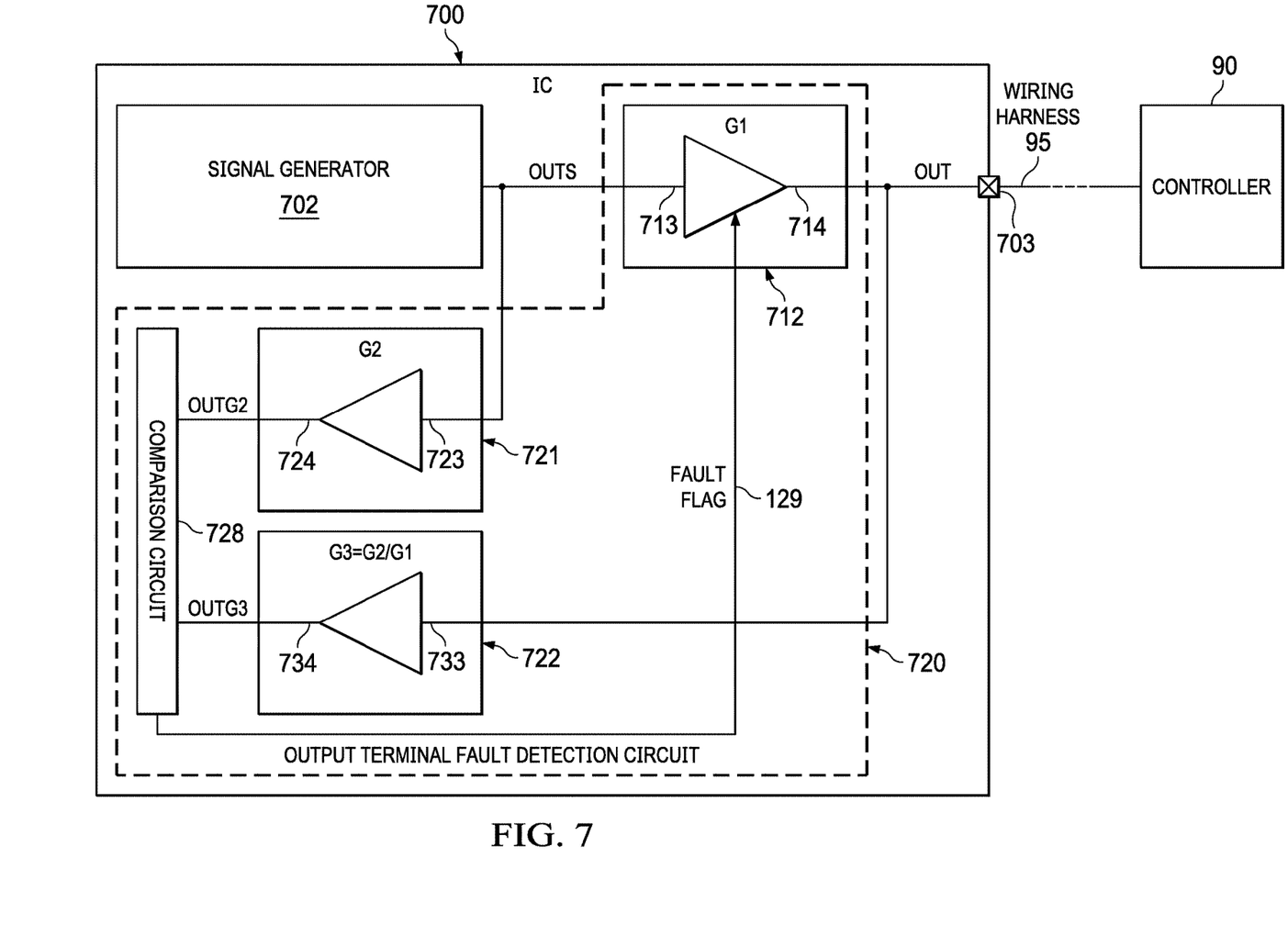
FIG. 7 illustrates an example of an IC containing an output terminal fault detection circuit that processes single-ended signals.

The IC 100 is, for example, a packaged semiconductor device implemented on a semiconductor die/substrate. The semiconductor substrate, with the circuits fabricated thereon, may be attached to external terminals (e.g. a leadframe, a ball-grid array, a pin-grid array or any type of semiconductor device interconnection) and encapsulated (e.g. in a protective mold compound, a chip-scale package, a ceramic package or any type of semiconductor packaging). The IC 100 may be referred to as a "chip." The circuits include a signal conditioning circuit 110 and an output terminal fault detection circuit 120 (which may include a portion of the signal conditioning circuit 110). The signal conditioning circuit 110 includes a gain stage 111 having a gain designated as "G". The sensor 80 connects to the gain stage 111. The output of the gain stage 111 connects to an input 113 of a second gain stage 112. The output 114 of the second gain stage 112 is coupled to output terminals 103 and 104 of the IC 100. The output terminals 103 and 104 of the IC 100 are connected through a wiring harness 95 (e.g., an electrical cable) to a downstream device such as a controller 90. The second gain stage 112 has a gain designated as "G1." G1 may be 1 (unity gain) or a gain value other than 1 (e.g., greater than 1). In some examples, the length of the wiring harness 95 is substantial enough that the second gain stage 112 is configured for a gain greater than 1. The second gain stage 112 is an output driver to drive the sensor's signal through the wiring harness 95 to the controller 90. While the signal 71, as well as signals OUTP/OUTSN, and OUTP/OUTN (described below) are illustrated as differential signals, in other embodiments these signals are single-line (non-differential) signals and may be referenced to a common potential (e.g. ground). FIG. 7 (described below) provides an example of an output terminal fault detection circuit 720 usable in a system that implements single-line signals instead of differential signals.

In the example of FIG. 1, the signaling through the signal conditioning circuit 110 between the sensor 80 and the controller 90 is differential signaling comprising a positive signal and a negative signal. The positive and negative output signals of the first gain stage (and thus the positive and negative input signals of the second gain stage 112) are labeled as OUTSP and OUTSN, respectively. The positive and negative output signals of the second gain stage (and thus the positive and negative input signals provided to the controller 90 through the wiring harness 95) are labeled as OUTP and OUTN, respectively.

The illustrative output terminal fault detection circuit 120 includes amplifiers 121 and 122 and a comparison circuit 128. The amplifier 121 has an input 123 and an output 124. The amplifier 122 has an input 133 and an output 134. The input 123 of the amplifier 121 is coupled to the input 113 of the second gain stage 112. The input 133 of the amplifier 122 is coupled to the output 114 of the second gain stage 112. The output 124 of the amplifier 123 is coupled to the comparison circuit 128. The output 134 of the amplifier 122 is also coupled to the comparison circuit 128.

In FIG. 1, the second gain stage 112 is shown as part of the signal conditioning circuit 110. However, the second gain stage 112 generally is a dual-purpose circuit—it provides gain and/or drive capability for the sensor's signal to be provided over the wiring harness 95 to controller 90, and it also provides signals to be processed by amplifiers 121 and 122 and comparison circuit 128 to detect whether a fault has occurred on either or both of output pins 103 and 104. Thus, the second gain stage 112 may be considered part of the signal conditioning circuit 110, part of the output terminal fault detection circuit 120, or a component of both the signal conditioning circuit 110 and the output terminal fault detection circuit 120.

The amplifier 121 is configured for a gain of "G2." The amplifier 122 is configured for a gain of "G3." If the gain G1 of the second gain stage 112 is 1 (unity gain), then the magnitude of the difference between the output signals OUTP and OUTN (represented as V(OUTP)−V(OUTN)) should be the same as the magnitude of the difference between the input signals OUTSP and OUTSN (represented as V(OUTSP)−V(OUTSN)). In general, however, G1 can be a value other than 1.

With differential signaling as shown in FIG. 1, the amplifiers 121 and 122 are difference amplifiers in that each amplifier 121 and 122 produces a single-ended output signal that represents the amplified difference in voltage between its input signals. That is, the output signal, OUTG2, of amplifier 121 is a voltage that is the amplified difference between V(OUTSP) and V(OUTSN). Similarly, the output signal, OUTG3, of amplifier 122 is a voltage that is the amplified difference between V(OUTP) and V(OUTN).

With the gain of amplifier 121 being G2, the voltage level of signal OUTG2 (V(OUTG2)) is:

$$V(OUTG2)=G2*\{V(OUTSP)-V(OUTSN)\}=G2*G*\{V(INP)-V(INN)\} \quad (1)$$

where V(INP) is the voltage level of the signal INP on the input terminal 72, and V(INN) is the voltage level of the signal INN on input terminal 73. The gain G3 of amplifier 122 is configured to be G2/G1. Accordingly, the voltage level of signal OUTG3 (V(OUTG3)) is:

$$V(OUTG3) = G3*\{V(OUTP)-V(OUTN)\} = \frac{G2}{G1}*\{V(OUTP)-V(OUTN)\} = \frac{G2}{G1}*G1*G*\{V(INP)-V(INN)\} = G2*G*\{V(INP)-V(INN)\} \quad (2)$$

Therefore, during normal operation (i.e., the voltages on the output terminals 103 and 104 are not altered by contaminants in the wiring harness 95, short-circuits, etc.) V(OUTG3) and V(OUTG2) are approximately the same voltage. The comparison circuit 128 compares V(OUTG2) to V(OUTG3) and asserts a FAULT FLAG signal 129 (e.g., asserted high) responsive to V(OUTG2) and V(OUTG3) not being equal to each other. The FAULT FLAG signal 129 is coupled to the second gain stage 112 in the example of FIG. 1 to cause the second gain stage 112 to be disabled, or to tri-state its output signals OUTP and OUTN, if a fault exists.

The controller 90 is configured to respond to a disabled second gain stage or tri-stated output signals OUTP and OUTN in a safe manner. For example, the controller 90 may cease controlling a motor in response to the OUTP and OUTN signals.

The system can be configured for a desired amount of mismatch between V(OUTG2) and V(OUTG3) in order for the comparison circuit 128 to assert the FAULT FLAG signal 129. For example, it may be desired that the FAULT FLAG signal 129 is not asserted until V(OUTG2) is more than 100 mV different than V(OUTG3). In another example, it may be desired that the FAULT FLAG signal 129 is not asserted until V(OUTG2) is more than 500 mV. The amount of voltage difference between V(OUTG2) and V(OUTG3) that triggers the comparison circuit 128 to assert the FAULT FLAG signal 129 is referred to as the VFAULT voltage. The VFAULT voltage can be set depending on, for example, the desired sensitivity of the comparison circuit 128. As explained below, the comparison circuit 128 is configured for the desired VFAULT voltage.

Figure 2:
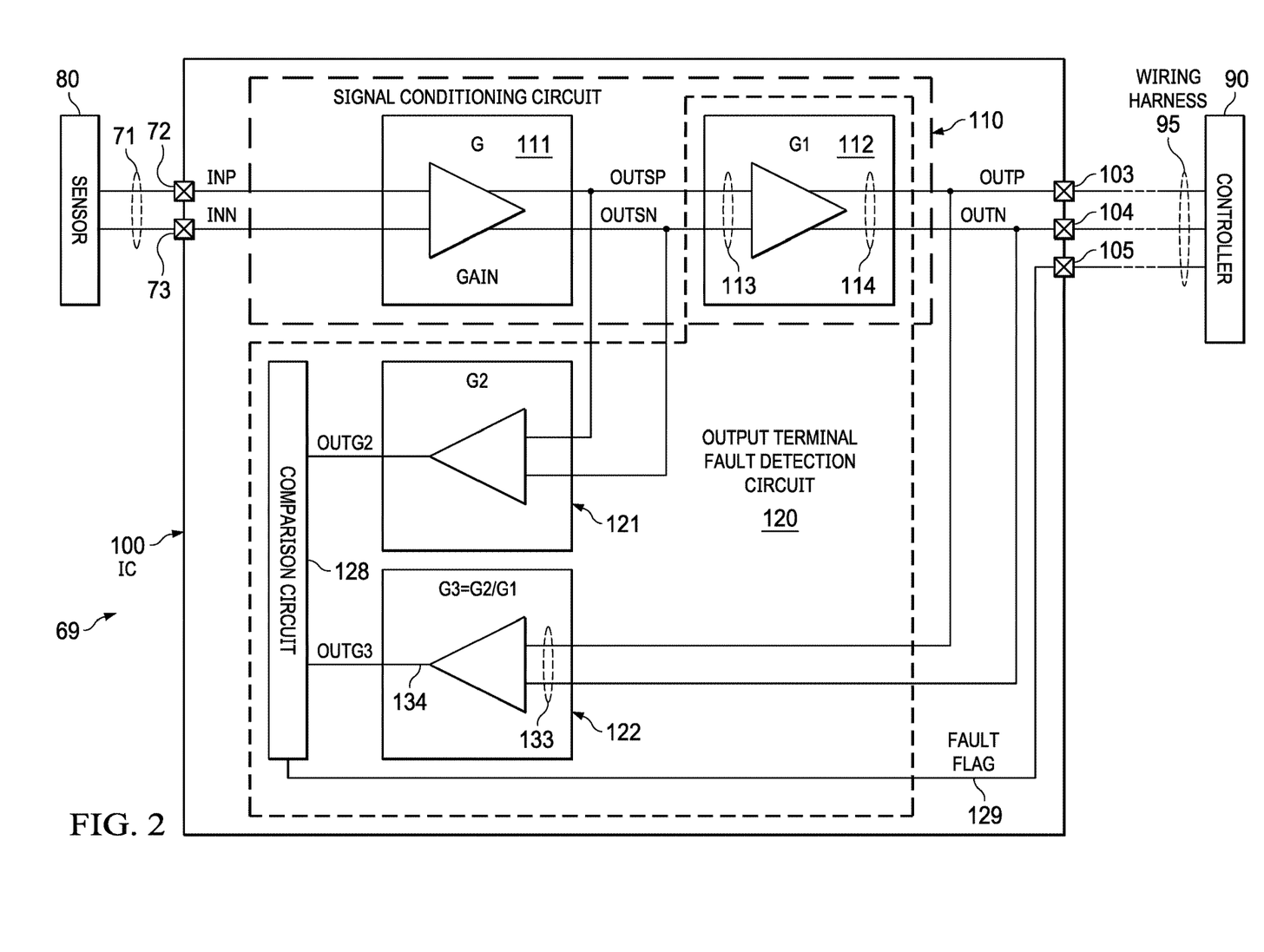
FIG. 2 illustrates an example of an IC containing an output terminal fault detection circuit that generates a fault flag signal provided to an output terminal of the IC.

FIG. 2 illustrates system 69 of another example embodiment. System 69 is similar to system 70, except for system 69 the FAULT FLAG signal 129 is provided to an output pin 105 on the IC 100 instead of to the second gain stage 112. The wiring harness 95 may include a conductor coupled to the output terminal 105. The controller 90 thus may directly read the logic state of the FAULT FLAG signal 129, and respond accordingly. For example, the controller 90 may ignore the OUTP and OUTN signals on terminals 103 and 104 and enter an application-specific safe mode of operation. In some implementations, the FAULT FLAG signal 129 may be provided to both the second gain stage 112 and to the output terminal 105.

While in theory, V(OUTG2) and V(OUTG3) should be equal to each other (absent a fault condition), in practice however, due to offset voltages and gain inaccuracies between the amplifiers 121 and 122, V(OUTG3) and V(OUTG2) may deviate from their expected voltage levels. For example, the gain G3 of amplifier 122 may not be exactly equal to G2/G1 due offset voltages within the amplifier 122. Further, the gain G3 of amplifier 122 is a function of a ratio of resistors within the amplifier 122 and the resistors may deviate from their intended values due to manufacturing tolerances. Similarly, the gain G2 of amplifier 121 may deviate from its intended value. The comparison circuit 128 may include comparators (described below) with configurable threshold voltages to account for gain and offset voltage mismatches across amplifiers 121 and 122.

Figure 3:
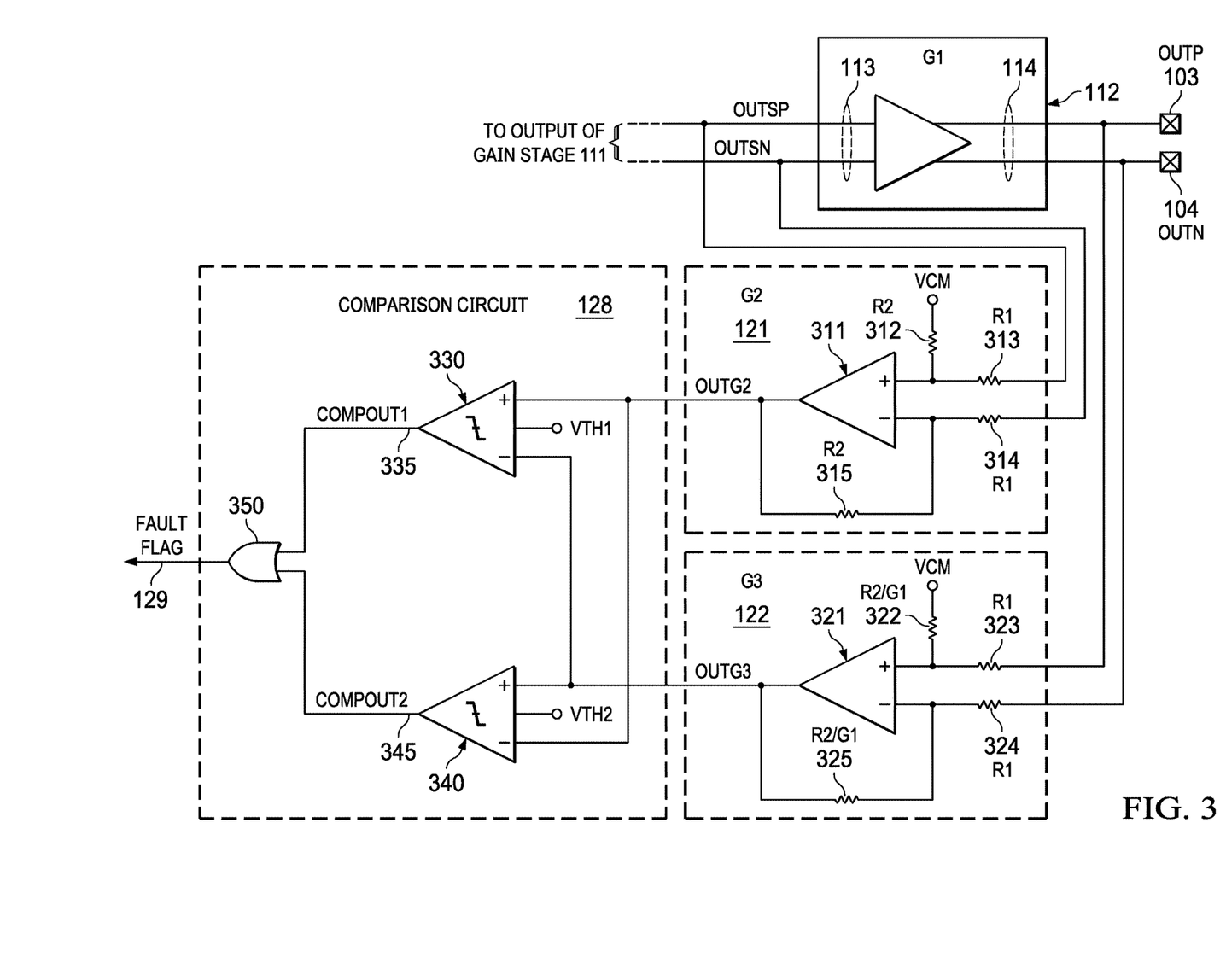
FIG. 3 shows an example of an implementation of the output terminal fault detection circuit of FIGS. 1 and 2.

FIG. 3 shows additional detail for the amplifiers 121 and 122 and for the comparison circuit 128 in accordance with an illustrative example. Amplifier 121 includes an operational amplifier (OP AMP) 311 and resistors 312, 313, 314, and 315. The OP AMP 311 includes a non-inverting (positive) input and an inverting (negative) input. The non-inverting input is coupled through the resistor 313 to OUTSP, and the inverting input is coupled through the resistor 314 to OUTSN. Resistor 312 is coupled between the non-inverting input and a common mode voltage (VCM). The common mode voltage VCM is a fixed voltage level and ensures a proper biasing for the amplifiers. Resistor 315 is coupled between the inverting input and the output of the OP AMP 311. The output of the OP AMP 311 provides the signal OUTG2. Resistors 313 and 314 are nominally equally to each other and have a value designated as R1. Resistors 312 and 315 are nominally equally to each other and have a value designated as R2. The gain G2 of amplifier 121 is equal to:

$$G2 = \frac{R2}{R1} \tag{3}$$

Amplifier 122 includes an OP AMP 321 and resistors 322, 323, 324, and 325. The OP AMP 321 includes a non-inverting input and an inverting input. The non-inverting input is coupled through the resistor 323 to OUTP, and the inverting input is coupled through the resistor 324 to OUTN. Resistor 322 is coupled between the non-inverting input and VCM. Resistor 325 is coupled between the inverting input and the output of the OP AMP 321. The output of the OP AMP 321 provides the signal OUTG3. Resistors 323 and 324 are nominally equally to each other and have a value designated as R1. Resistors 322 and 325 are nominally equally to each other and have a value designated as R2/G1. The gain G3 of amplifier 122 is equal to:

$$G3 = \frac{R2}{G1 * R1} \tag{4}$$

Accordingly, based on Eq. (1) above and ignoring VCM, V(OUTG2) is equal to:

$$V(OUTG2) = \frac{R2}{R1} G * \{V(INP) - V(INN)\} + VOS2 \tag{5}$$

where VOS2 is the output offset voltage of amplifier 121. Similarly, based on Eq. (2) above, V(OUTG3) is equal to:

$$V(OUTG3) = \frac{R2}{G1 \times R1} * \{V(OUTP) - V(OUTN)\} + VOS3 \tag{6}$$

where VOS3 is the output offset voltage of amplifier 122. Assuming VOS3 being equal to VOS2 and because V(OUTP)−V(OUTN) equals G*G1*{V(INP)−V(INN)}, nominally V(OUTG3) is approximately equal to V(OUTG2).

However, differences in the offset voltages VOS2 and VOS3 and in the gains G2 and G3 of the amplifiers 121 and 122 can cause false triggers for the comparison circuit 128 (e.g., the FAULT FLAG 129 is asserted to a fault state (e.g., high) to indicate a fault condition when no fault condition actually exists). FIG. 3 illustrates that the comparison circuit 128 includes comparators 330 and 340, and each comparator has a configurable threshold voltage. Comparator 330 has a configurable threshold voltage designated as VTH1, and comparator 340 has a configurable threshold voltage designated as VTH2. By configuring the threshold voltages VTH1 and VTH2, the offset voltage mismatches and gain inaccuracies of the amplifiers 121 and 122 can be substantially nullified. An illustrative technique for configuring the threshold voltages VTH1 and VTH2 is described below.

Comparator 330 has a non-inverting/positive (+) input and an inverting/negative (−) input. Similarly, comparator 340 has non-inverting/positive and an inverting/negative inputs. The output (OUTG2) of amplifier 121 is coupled to the positive input of comparator 330, and the output (OUTG3) of amplifier 122 is coupled to the negative input of comparator 330. The positive and negative inputs of comparator 340 are also coupled to the outputs of amplifiers 121 and 122, but with reverse polarity connections. That is, the output (OUTG2) of amplifier 121 is coupled to the negative input of comparator 340, and the output (OUTG3) of amplifier 122 is coupled to the positive input of comparator 340. Comparator 330 asserts its output signal 335 (COMPOUT1) high responsive to OUTG2 being more than the threshold voltage VTH1 greater than OUTG3 (e.g. the output signal 335 is high if [(OUTG2)−(OUTG3)>VTH1]). Comparator 330 maintains its output signal 335 at logic high until OUTG2 is more than the threshold voltage VTH1 below OUTG3. Comparator 340 asserts its output signal 345 (COMPOUT2) high responsive to OUTG3 being more than the threshold voltage VTH2 greater than OUTG2 (e.g. the output 345 is high if [(OUTG3)−(OUTG2)>VTH2]), and maintains output signal 345 high until OUTG3 is more than the threshold voltage VTH2 below OUTG2. The comparison circuit 128 thus implements a window comparator in which one of the COMPOUT1 or COMPOUT2 signals 335 or 345 is asserted high when a respective one of the amplifier output signals (OUTG2 or OUTG3) is more than the respective VTH1 or VTH2 threshold voltage larger than the other amplifier's output signal.

The outputs of the comparators 330 and 340 are coupled to a logic gate 350. The logic gate 350 produces the FAULT FLAG 129. In the example of FIG. 3, the logic gate 350 is an OR gate, but can be or include other types of logic gates. By OR'ing output signals COMPOUT1 and COMPOUT2, the FAULT FLAG 129 is asserted high when either of the comparators' output signals 335 or 345 is asserted high.

Figure 4:
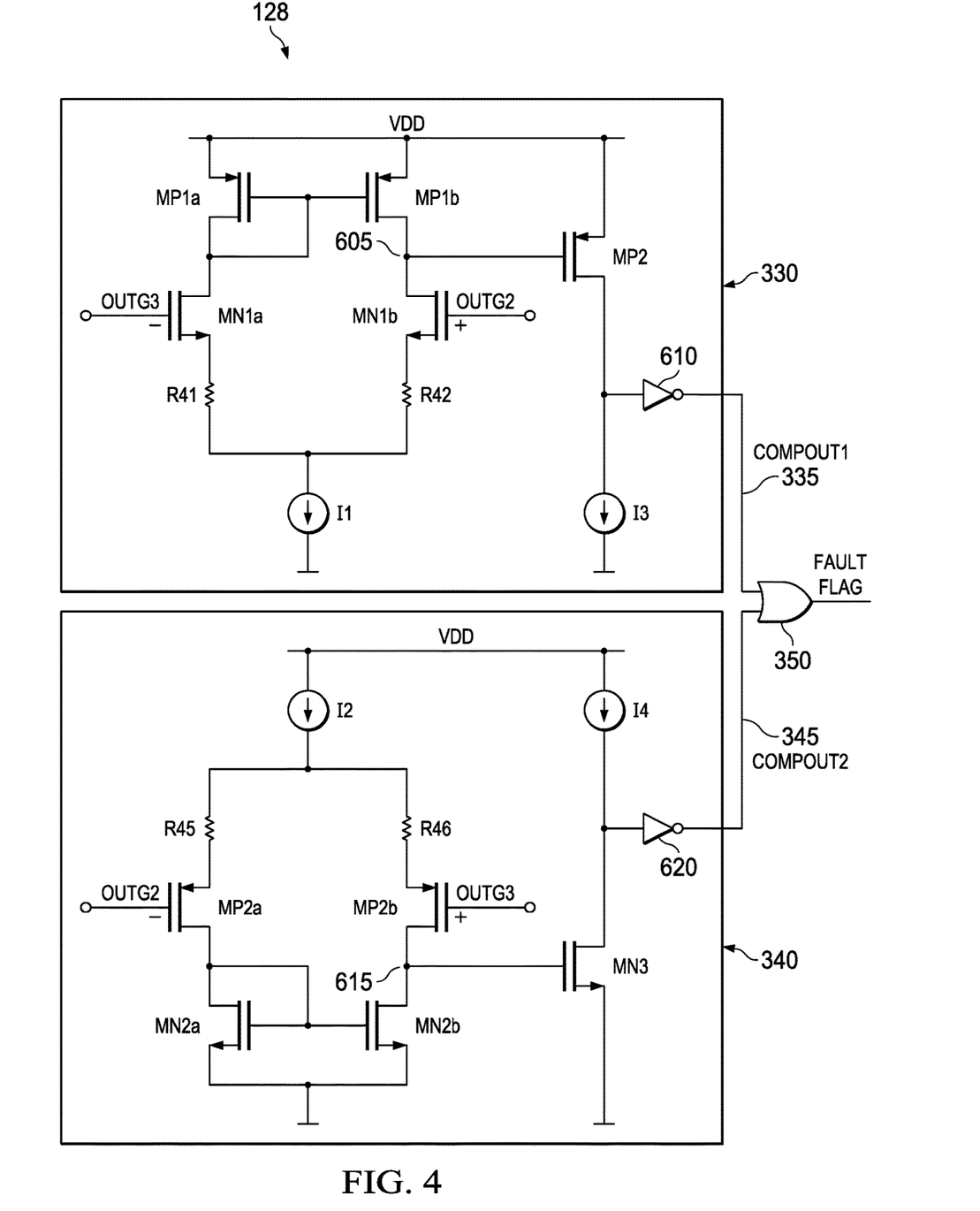
FIG. 4 illustrates comparators included in the output terminal fault detection circuit of FIG. 3.

FIG. 4 shows an example implementation of comparison circuit 128. Comparison circuit 128 includes comparators 330 and 340 and logic gate 350. Comparator 330 includes N-type metal oxide semiconductor field effect transistors (NMOS transistors) MN1a and MN1b, P-type metal oxide semiconductor field effect transistors (PMOS transistors) MP1a, MP1b, and MP2, resistors R41 and R42, current sources 11 and 13, and inverter 610. Transistors MP1a and MP1b are connected together to form a current mirror. The drain of transistor MP1a is coupled to the drain of transistor MN1a. Resistor R41 is coupled between the source of transistor MN1a and current source 11. The drain of transistor MP1b is coupled to the drain of transistor MN1b and to the gate of transistor MP2 at node 605. Resistor R42 is coupled between the source of transistor MN1b and current source 11. The drain of transistor MP2 is coupled to current source 13 and to the input of inverter 610. The output of inverter 610 produces the COMPOUT1 signal 335. The gate of transistor MN1a provides the negative input for comparator 330, and the gate of transistor MN1b provides the positive input for comparator 330. Signal OUTG3 is provided to the gate of transistor MN1a, and signal OUTG2 is provided to the gate of transistor MN1b.

Transistors MN1a and MN1b are nominally matched transistors, in that they have the same threshold voltages and are of the same size (size being the ratio of channel width (W) to channel length (L)). Similarly, transistors MP1a and MP1b are nominally matched transistors. Assuming the resistance of resistor R41 equals the resistance of R42, the comparator input stages are balanced. In this condition, if V(OUTG3) is equal to V(OUTG2), the tail current from current source 11 divides approximately evenly between transistors MN1a and MN1b. However, if V(OUTG3) becomes larger than V(OUTG2), then more of the tail current of current source 11 will flow through transistor MN1a, which, due to the current mirror formed by transistors MP1a and MP1b, results in an increase in the current through transistor MP1b. To balance the current at node 605 (with an increase in the drain current through transistor MP1b), the gate of transistor MP2 is charged by the excess current. This causes the voltage on the source of transistor MP2 to increase turning on MP2, and thus the voltage on the input of inverter 610 increases towards VDD. The inverter 610 responds by pulling its output signal COMPOUT1 low. Reciprocally, if V(OUTG3) becomes smaller than V(OUTG2), then less of the tail current of current source 11 will flow through transistor MN1a, which results in a decrease in the current through transistor MP1b. To balance the current at node 605 (with a decrease in the drain current through transistor MP1b), the gate of transistor MP2 is discharged which, in turn, causes the voltage on the source of transistor MP2 and thus the input of inverter 610 to decrease. The inverter 610 responds by forcing its output signal COMPOUT1 high.

Comparator 340 includes NMOS transistors MN2a, MN2b, and MN3, PMOS transistors MP2a and MP2b, resistors R45 and R46, current sources 12 and 14, and inverter 620. Transistors MN2a and MN2b are connected together to form a current mirror. The drain of transistor MN2a is coupled to the drain of transistor MP2a. Resistor R45 is coupled between the source of transistor MP2a and current source 12. The drain of transistor MN2b is coupled to the drain of transistor MP2b and to the gate of transistor MN3 at node 615. Resistor R46 is coupled between the source of transistor MP2b and current source 12. The drain of transistor MN3 is coupled to current source 14 and to the input of inverter 620. The output of inverter 620 produces the COMPOUT2 signal 345. The gate of transistor MP2a provides the negative input for comparator 340, and the gate of transistor MP2b provides the positive input for comparator 340. Signal OUTG2 is provided to the gate of transistor MP2a, and signal OUTG3 is provided to the gate of transistor MP2b. Comparator 340 operates in a similar fashion as that described above with regard to comparator 330.

While the configurations of comparators 330 and 340 utilize particular NMOS and PMOS transistors, different transistors may be used instead. For example, PMOS transistor can be used in place of NMOS transistors with some modifications to the circuit (such as that shown for comparators 330 and 340) and vice versa. In addition, bipolar transistors (either NPN or PNP) may be utilized instead of the NMOS and PMOS transistors.

Figure 5:
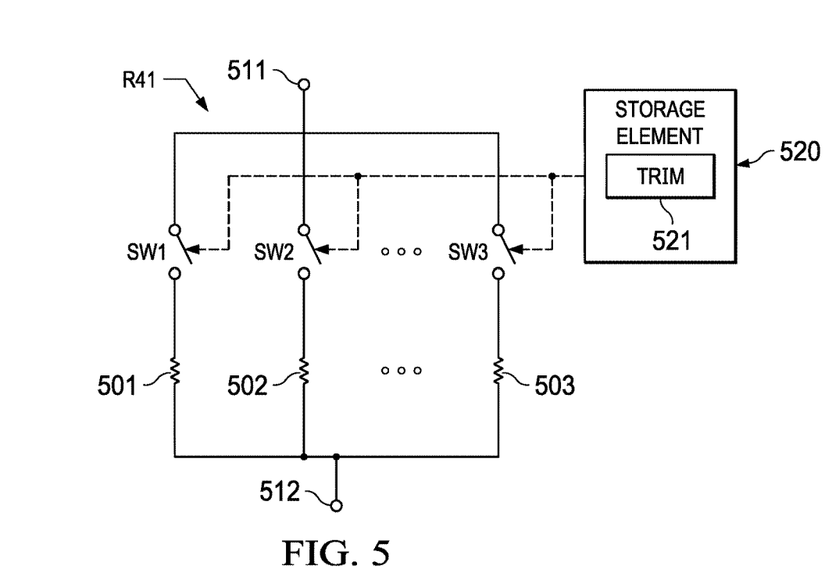
FIG. 5 shows an example of a configurable resistor usable in the comparators of FIG. 4.

Any of a variety of techniques can be employed to configure the threshold voltage of either or both of the comparators 330 and 340. One such technique includes configuring either or both of the resistors R41 and R42 in comparator 330, and similarly resistors R45 and R46 in comparator 340. A particular threshold voltage (VTH1) for comparator 330 can be implemented by configuring the resistance of resistor R41 to a certain value relative to the resistance of resistance R42. FIG. 5 illustrates an example of a resistor R41 comprising resistors 501, 501, and 503. Although three resistors 501-503 are shown in this example, a different number of resistors can be included in other examples. In one example, the resistances of resistors 501-503 are the same (although they can be different as desired). Each resistor is coupled to a corresponding switch (switches SW1, SW2, and SW3). The two terminals of the resistor R41 include terminals 511 and 512. By closing particular ones of switches SW1-SW3, certain resistors of resistors 501-503 are connected in parallel between terminals 511 and 512, and thus resistance between terminals 511 and 512 can be configured to a desired resistance value. The example of FIG. 5 also shows that the IC 100 includes a storage element 520, which may be any suitable type of storage medium such as solid-state memory (e.g., random access memory, dynamic random access memory, static random access memory, read only memory), buffers, electronic fuses, or other types of memory implementable on a semiconductor device. The storage element 520 stores a trim value 521 which may include multiple bits, each bit configured to open or close a corresponding switch SW1-SW3.

Resistors R41, R42, R45 and/or R46 can be configured as is shown in FIG. 5. That is, a separate set of resistors and switches can be provided to implement any or all of resistors R42, R45, or R46, and storage element 520 may store a separate respective trim value 521 for each such set of resistors and switches. During a calibration process (e.g., at the factory, test facility, or during an initial setup period), the trim value 521 is determined and stored in the storage element. The trim value 521 is chosen based on the fault tolerance level after which the fault signal COMPOUT1 or COMPOUT2 needs to be asserted plus offset voltages and gain differences G2 and G3. Offset voltages (Vos) of the amplifiers with gains of G1, G2 or G3, along with comparators 330 and 340 are characterized. These values also can be set based on the expected offset voltages and gain differences. Let Voff_Char=Vos(G1)+Vos(G2)+Vos(G3), where VOS refers to the offsets of the gain stage 112 and amplifiers 121 and 122 as indicated by G1, G2, and G3. As explained above, the comparison circuit 128 can be configured for a target VFAULT voltage (the voltage difference between V(OUTG2) and V(OUTG3) that is needed to trigger assertion of the FAULT FLAG 129. VTH1 should be set equal to Voff_Char+Vos(330)+VFAULT. Similarly, VTH2 should be set equal to Voff_Char+Vos(340)+VFAULT. At power-on, the trim value 521 is used to close the respective switches to thereby configure the resistance of the resistor (e.g., R41, R42, R45, and/or R46) in accordance with the trim value.

By configuring a particular resistance difference between resistors R41 and R42, a target threshold voltage VTH1 for comparator 330 can be implemented. Similarly, by configuring a particular resistance difference between resistors R45 and R46, a target threshold voltage VTH2 for comparator 340 also can be implemented. The value of VTH1 can be the same or different as the value of VTH2.

Figure 6:
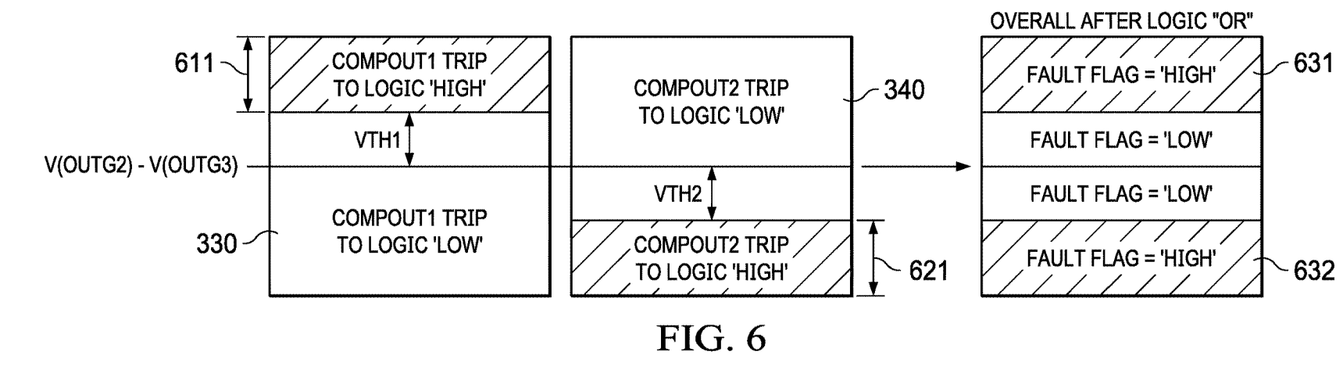
FIG. 6 illustrates the operation of the comparators of FIG. 4 with configurable threshold voltages.

FIG. 6 illustrates the operation of comparators 330 and 340. FIG. 6 depicts that comparator 330 asserts its COMPOUT1 output signal high at 611 responsive to V(OUTG2) being more than VTH1 higher than V(OUTG3), whereas comparator 340 asserts its COMPOUT2 output signal high at 621 responsive to V(OUTG3) being more than VTH2 higher than V(OUTG2). By ORing COMPOUT1 and COMPOUT2, the FAULT FLAG signal 129 is asserted logic high at 631 or 632.

FIG. 7 shows an example of an IC 700 in which the signals processed by an output terminal fault detection circuit 720 are single-ended signals (signals referenced to ground) rather than differential signals as in the examples of FIGS. 1-3. The IC 700 in FIG. 7 may include device 702 (which, for example, could be a signal generator, a sensor or a combination of the two) that generates/provides a single-ended signal 713 (OUTS) to a gain stage 712. However, in other example embodiments, device 702 may be external to IC 700. The gain stage 712 has an input 713 and an output 714. The signal on the output 714 is OUT. The output terminal fault detection circuit 720 includes amplifiers 721 and 722 and, in some example embodiments, gain stage 712. The gain of gain stage 712 is G1, and the gains of amplifiers 721 and 722 are G2 and G3, respectively. As explained above, gain G3 may be configured to be G2/G1. The output terminal fault detection circuit 720 includes a comparison circuit 728, which may be implemented as shown in the example of FIG. 4. IC 700 operates similarly to IC 100 except that IC 100 processes differential signals and IC 700 processes single-ended signals.

Figure 8:
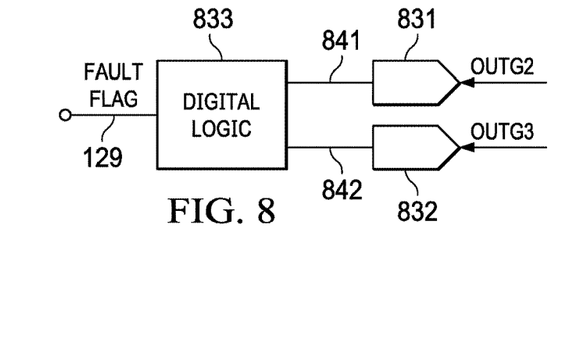
FIG. 8 shows an example digital implementation for the comparison circuit of the output terminal fault detection circuit.

The comparison circuits 128 and 728 of the output terminal fault detection circuits 120 and 720 are shown as analog-based circuits. In other embodiments, the comparison circuit is a digital circuit. FIG. 8 shows an example of a digital comparison circuit 828 that can be used as any of the comparison circuits (comparison circuits 128 and/or 728) discussed herein. The example comparison circuit 828 of FIG. 8 includes an analog-to-digital converter (ADC) 831, an ADC 832 and digital logic 833. ADC 831 receives and converts OUTG2 to a digital signal 841 and provides the digital signal 841 to digital logic 833. Similarly, ADC 832 receives and converts OUTG3 to a digital signal 842 and provides the digital signal 842 to digital logic 833. The digital logic 833 may comprise Boolean logic (AND gates, OR gates, inverters, etc.), flip-flops, a processor or any type of signal processing device. The digital logic 833 asserts the FAULT FLAG 129 responsive to the absolute value difference between digital signals 841 and 842 exceeding a threshold value. The threshold value for digital logic 833 may be chosen similar to that described above.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component. Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. A circuit having an output adapted to be coupled to an external device, comprising:
   a gain stage having an input and an output;
   a first amplifier having an input and an output, the input of the first amplifier is coupled to the input of the gain stage;
   a second amplifier having an input and an output, the input of the second amplifier is coupled to the output of the gain stage;
   a comparison circuit having a first input, a second input and a fault flag output, the first input coupled to the output of the first amplifier, the second input coupled to the output of the second amplifier and the fault flag output coupled to the circuit output; and wherein the fault flag output is asserted if the output of the first amplifier is more than a threshold value different than the output of the second amplifier.

2. The circuit of claim 1, wherein the comparison circuit includes:
a first comparator having an input and an output, the input of the first comparator is coupled to the output of the first amplifier;
a second comparator having an input and an output, the input of the second comparator is coupled to the output of the second amplifier; and
a logic gate having first and second logic gate inputs and an output, the first logic gate input is coupled to the output of the first comparator, the second logic gate input is coupled to the output of the second comparator and the logic gate output is coupled to the fault flag output.

3. The circuit of claim 1, wherein the fault flag output of the comparison circuit is coupled to the gain stage.

4. The circuit of claim 3, wherein the output of the gain stage is configured to be tri-stated responsive to the fault flag output being asserted.

5. The circuit of claim 1, wherein:
the gain stage is a driver whose input is a differential input and whose output is a differential output;
the input of the first amplifier is a differential input, the output of the first amplifier is a differential output, and the first amplifier is a difference amplifier; and
the input of the second amplifier is a differential input, the output of the second amplifier is a differential output, and the second amplifier is a difference amplifier.

6. The circuit of claim 1, wherein:
a gain of the gain stage is G1;
a gain of the first amplifier is G2; and
a gain of the second amplifier is approximately G2/G1.

7. The circuit of claim 1, further including a storage element coupled to at least one of the first or second comparators, the storage element configured to store a value usable to configure an offset of the at least one of the respective first or second comparators.

8. The circuit of claim 1, further including a semiconductor package, the semiconductor package having an output terminal and including the gain stage, and the output of the gain stage is connected to the output terminal.

9. The circuit of claim 1, wherein the circuit is implemented in a single semiconductor package.

10. A circuit, comprising:
a gain stage having an input and an output;
a first amplifier having an input and an output, the input of the first amplifier is coupled to the input of the gain stage;
a second amplifier having an input and an output, the input of the second amplifier is coupled to the output of the gain stage; and
a comparison circuit coupled to the outputs of the first and second amplifiers, the comparison circuit is configured to compare signals on the outputs of the first and second amplifiers and to generate a fault flag signal responsive to the output signal from the first amplifier being different than the output signal from the second amplifier.

11. The circuit of claim 10, wherein the comparison circuit comprises:
a first comparator having positive and negative inputs and an output, the positive input of the first comparator is coupled to the output of the first amplifier, and the negative input of the first comparator is coupled to the output of the second amplifier; and
a second comparator having positive and negative inputs and an output, the positive input of the second comparator coupled to the output of the second amplifier, and the negative input of the second comparator coupled to the output of the first amplifier.

12. The circuit of claim 11, wherein the comparison circuit comprises a logic gate having first and second logic gate inputs, the first logic gate input is coupled to the output of the first comparator, and the second logic gate is input coupled to the output of the second comparator.

13. The circuit of claim 10, wherein the circuit includes an output adapted to be coupled to an external device and to provide an output signal to the external device, and wherein the external device is blocked from receiving the output signal if the fault flag signal is asserted.

14. The circuit of claim 10, wherein:
a gain of the gain stage is G1;
a gain of the first amplifier is G2; and
a gain of the second amplifier is approximately G2/G1.

15. The circuit of claim 10, further including a storage element coupled to at least one of the first or second comparators, the storage element configured to store a value usable to configure an offset of the at least one of the respective first or second comparators.

16. The circuit of claim 10, wherein the comparison circuit comprises an analog-to-digital converter.

17. A circuit having an output adapted to be coupled to an external device for providing one or more output signals to the external device, the circuit comprising:
a signal conditioning circuit having an input and an output, the output of the signal conditioning device coupled to the output of the circuit;
a first amplifier having a first input and a first output, the first input is coupled to the signal conditioning device;
a second amplifier having a second input and a second output, the second input is coupled to the output of the signal conditioning device;
a comparison circuit having a third input, a fourth input and a fault flag output, the third input coupled to the first output, the fourth input coupled to the second output and the fault flag output coupled to the output of the circuit; and
wherein the external device is blocked from receiving the one or more output signals in response to the fault flag output being asserted.

18. The circuit of claim 17, wherein the comparison circuit includes:
a first comparator having positive and negative inputs and an output, the positive input of the first comparator is coupled to the first output, and the negative input of the first comparator is coupled to the second output; and
a second comparator having positive and negative inputs and an output, the positive input of the second comparator is coupled to the second output, and the negative input of the second comparator is coupled to the first output.

19. The circuit of claim 18, further including a logic gate having first and second logic gate inputs, the first logic gate input is coupled to the output of the first comparator, and the second logic gate input is coupled to the output of the second comparator.

20. The circuit of claim 18, further including a storage element coupled to at least one of the first or second comparators, the storage element configured to store a value usable to configure an offset of the at least one of the respective first or second comparators.

\* \* \* \* \*